United States Patent
Mruthyunjaya et al.

(10) Patent No.: US 10,396,110 B2
(45) Date of Patent: *Aug. 27, 2019

(54) REDUCTION OF TFT INSTABILITY IN DIGITAL X-RAY DETECTORS

(71) Applicants: CARESTREAM HEALTH, INC., Rochester, NY (US); Kyung Hee University, Rochester, NY (US)

(72) Inventors: Ravi K. Mruthyunjaya, Penfield, NY (US); Timothy J. Tredwell, Fairport, NY (US); Jin Jang, Seoul (KR); Mallory Mativenga, Seoul (KR); Jae Gwang Um, Seoul (KR); Mohammad Masum Billah, Seoul (KR)

(73) Assignees: Carestream Health, Inc., Rochester, NY (US); Kyung Hee University, Seoul (KR)

( * ) Notice: Subject to any disclaimer, the term of this patent is extended or adjusted under 35 U.S.C. 154(b) by 0 days.

This patent is subject to a terminal disclaimer.

(21) Appl. No.: 16/156,278

(22) Filed: Oct. 10, 2018

(65) Prior Publication Data

US 2019/0074308 A1    Mar. 7, 2019

Related U.S. Application Data

(62) Division of application No. 15/563,961, filed as application No. PCT/US2016/027041 on Apr. 12, 2016, now Pat. No. 10,147,749.

(Continued)

(51) Int. Cl.
*H01L 27/146*    (2006.01)
*G01T 1/24*    (2006.01)
(Continued)

(52) U.S. Cl.
CPC ........ *H01L 27/14616* (2013.01); *G01T 1/247* (2013.01); *H01L 27/14612* (2013.01);
(Continued)

(58) Field of Classification Search
CPC ......... H01L 27/14616; H01L 27/14612; H01L 27/14663; H01L 27/14692;
(Continued)

(56) References Cited

U.S. PATENT DOCUMENTS

| 2010/0025679 A1* | 2/2010 | Yamazaki | H01L 27/1225 257/43 |
| 2010/0072467 A1* | 3/2010 | Yamazaki | H01L 27/1225 257/43 |

(Continued)

FOREIGN PATENT DOCUMENTS

WO    2013172237    11/2013

OTHER PUBLICATIONS

International Search Report, dated Jun. 30, 2016 International Application No. PCT/US2016/027041, 2 pages.

(Continued)

*Primary Examiner* — David P Porta
*Assistant Examiner* — Gisselle Gutierrez

(57) ABSTRACT

A digital radiographic detector uses an IGZO active layer in the switching element for each imaging pixel in a two-dimensional array of imaging pixels. Each imaging pixel has a photo-sensitive element and the switching element. Read-out circuits electrically connected to the two-dimensional array generate a radiographic image by reading out image data by switching on and off the switching elements. The IGZO active layer may be formed having a thickness less than about 7 nm.

18 Claims, 8 Drawing Sheets e) SOURCE / DRAIN METAL FORMATION AND FINAL TFT PASSIVATION.

Related U.S. Application Data

(60) Provisional application No. 62/221,645, filed on Sep. 22, 2015, provisional application No. 62/146,439, filed on Apr. 13, 2015.

(51) Int. Cl.
*H01L 29/49* (2006.01)
*H01L 29/66* (2006.01)
*H01L 29/786* (2006.01)
*H01L 21/02* (2006.01)
*H01L 21/443* (2006.01)
*H01L 27/12* (2006.01)

(52) U.S. Cl.
CPC .. *H01L 27/14618* (2013.01); *H01L 27/14658* (2013.01); *H01L 27/14663* (2013.01); *H01L 27/14692* (2013.01); *H01L 27/14694* (2013.01); *H01L 29/4908* (2013.01); *H01L 29/66969* (2013.01); *H01L 29/78693* (2013.01); *H01L 21/02164* (2013.01); *H01L 21/02274* (2013.01); *H01L 21/02565* (2013.01); *H01L 21/02592* (2013.01); *H01L 21/02631* (2013.01); *H01L 21/443* (2013.01); *H01L 27/1225* (2013.01)

(58) Field of Classification Search
CPC ........... H01L 27/14694; H01L 29/4908; H01L 27/14618; H01L 27/14658; H01L 29/66969; H01L 29/78693; H01L 21/02631; H01L 21/02565; H01L 21/02274; H01L 21/02164; H01L 21/02592; H01L 27/1225; H01L 21/443; G01T 1/247
USPC .................................................. 250/370.09
See application file for complete search history.

(56) References Cited

U.S. PATENT DOCUMENTS

| | | | |
|---|---|---|---|
| 2011/0127593 A1* | 6/2011 | Hayashi | H01L 27/1461 257/292 |
| 2011/0248909 A1* | 10/2011 | Sato | G09G 3/344 345/107 |
| 2012/0069425 A1* | 3/2012 | Sato | G09G 3/3446 359/296 |
| 2014/0014847 A1 | 1/2014 | Chang et al. | |
| 2014/0042427 A1 | 2/2014 | Hung et al. | |
| 2014/0131696 A1 | 5/2014 | Ono et al. | |
| 2014/0175385 A1* | 6/2014 | Li | H01L 27/3248 257/40 |
| 2016/0260746 A1* | 9/2016 | Wang | H01L 27/1225 |
| 2016/0358541 A1* | 12/2016 | Li | G09F 9/33 |
| 2017/0179298 A1* | 6/2017 | Koezuka | H01L 29/66742 |
| 2018/0062101 A1* | 3/2018 | Li | H01L 51/56 |
| 2018/0108842 A1* | 4/2018 | Li | G03F 7/0007 |

OTHER PUBLICATIONS

Piero Migliorato et al., "Determination of flat band voltage in thin film transistors: The case of amorphous-indium gallium zinc oxide," Applied Physics Letters, 2012, 100, pp. 073506-1-073506-4.

* cited by examiner a) GATE METAL FORMATION b) DEPOSITION OF GATE INSULATOR, OXIDE SEMICONDUCTOR, AND BACK CHANNEL PASSIVATION IN A CLUSTER TOOL, WITHOUT BREAKING VACUUM c) PATTERNING OF BACK CHANNEL PASSIVATION TO FORM AN ETCH STOPPER d) ACTIVE ISLAND FORMATION e) SOURCE / DRAIN METAL FORMATION AND FINAL TFT PASSIVATION.

| a-IGZO THICKNESS (nm) | $V_{ON}$ [V] | | $\mu FE$ [cm$^2$V$^{-1}$s$^{-1}$] | | SS [V / dec] | | Nit (x10$^{11}$cm$^{-2}$) | | dN$_{gap}$/dE (x10$^{12}$cm$^{-2}$eV$^{-1}$) | |
|---|---|---|---|---|---|---|---|---|---|---|
| | BEFORE NBIS | AFTER NBIS | BEFORE NBIS | AFTER NBIS | BEFORE NBIS | AFTER NBIS | BEFORE NBIS | AFTER NBIS | BEFORE NBIS | AFTER NBIS |
| 3 | 0.0 | -1.6 | 1.60 | 1.68 | 0.100 | 0.196 | -2.00 | -0.12 | -9.59 | -9.94 |
| 5 | -1.2 | -6.0 | 17.05 | 17.43 | 0.127 | 0.136 | -2.91 | -0.57 | -4.16 | -5.13 |
| 20 | -2.8 | -10.0 | 18.49 | 18.88 | 0.152 | 0.171 | -1.57 | 0.42 | -2.59 | -3.59 |
| 50 | -4.4 | -13.2 | 19.15 | 19.47 | 0.276 | 0.375 | 0.40 | 2.37 | -1.32 | -2.29 |
| 100 | -4.8 | -18.0 | 20.02 | 20.19 | 0.426 | 0.439 | 1.73 | 3.28 | -0.86 | -2.25 |

*FIG. 6C*

REDUCTION OF TFT INSTABILITY IN DIGITAL X-RAY DETECTORS

CROSS REFERENCE TO RELATED APPLICATIONS

This application is a divisional patent application of U.S. patent application Ser. No. 15/563,961, filed Oct. 3, 2017, in the name of Mruthyunjaya, et al., entitled REDUCTION OF TFT INSTABILITY IN DIGITAL X-RAY DETECTORS, which is a 371 of PCT patent application PCT/US16/27041 filed Apr. 12, 2016, which claims priority to U.S. Patent Application Ser. No. 62/146,439, filed Apr. 13, 2015, in the name of Mruthyunjaya, et al., and entitled STABILIZED AMORPHOUS-OXIDE-SEMICONDUCTOR THIN-FILM TRANSISTORS, and to U.S. Patent Application Ser. No. 62/221,645, filed Sep. 22, 2015, in the name of Tredwell, and entitled REDUCTION OF BIAS AND LIGHT INSTABILITY OF MIXED OXIDE THIN-FILM TRANSISTORS, both of which are hereby incorporated by reference herein as if fully set forth in their entirety.

BACKGROUND OF THE INVENTION

The subject matter disclosed herein relates to digital radiographic (DR) detectors, in particular, to the use of amorphous indium-gallium-zinc-oxide (a-IGZO) thin film transistor (TFT) switching elements in the imaging pixels of a DR detector.

Mixed oxide semiconductor-based thin-film transistors (TFTs) for applications in active matrix displays (AMDS) has generated a body of experimental and theoretical studies, in particular to amorphous indium-gallium-zinc-oxide (a-IGZO). For applications in AMDS, reliability and stability of the TFTs used as pixel switching elements are of primary concern. Since the switching TFT of an AMD pixel is mostly biased negatively, while illuminated from the display backlight, stability against negative gate-bias stress and visible light illumination is of particular importance for commercialization. Although the effect of combined negative gate-bias and light illumination stress (NBIS) has been the focus of investigations and found to cause negative threshold-voltage ($V_{TH}$) shift, ways of completely suppressing it have not yet been established. Since the TFT's $V_{TH}$ stability has a strong bearing on display uniformity, lifetime and pixel architecture, some researchers have proposed subjecting mixed oxide TFTs to post-deposition annealing at high temperatures under wet, oxygenated, ozonated, or nitrogenated environments as a way of minimizing the NBIS-induced instability. Others have proposed the use of light shields, nitrogen cap layers, high quality dielectrics (both as gate insulators and passivation layers), but such methods suppress the NBIS-induced instability to limited extents.

Recently, bulk-accumulation, which is achieved by the use of a dual-gate structure in which the top-gate and bottom-gate are electrically shorted together, has been shown to reduce the NBIS instability of mixed oxide TFTs with thin semiconductor layers (<25 nm). However, similar to other stability improvement methods, bulk accumulation also suppresses the NBIS instability to limited extents. There have been reports that have focused on the bias stability of mixed oxide TFTs and have indicated the importance of the semiconductor thickness in the stability of the TFTs. Some researchers have reported that the bias stability of the TFTs became better as semiconductor thickness increased, whereas others have reported that it worsened. Others showed opposite trends for wet annealed and un-annealed TFTs. For wet annealed TFTs, the $V_{TH}$ shift ($\Delta V_{TH}$) decreased with increasing semiconductor thickness and for un-annealed TFTs, $\Delta V_{TH}$ increased with increasing semiconductor thickness. It was considered that the density of trap states increases with increasing semiconductor thickness in un-annealed TFTs, whereas in wet annealed TFTs, there is almost no bulk effect. Device structure and the type of dielectrics used may also be a source of the differences in the trends observed with varying semiconductor thickness. For instance, the stability of inverted staggered devices without a passivation layer is more likely to improve with increasing semiconductor thickness because the thicker the semiconductor, the further away is the front channel (bottom surface of the semiconductor layer) from the absorption/desorption processes occurring at the top surface. In addition to the possibility of varying the types and/or ratios of the component oxides, non-reproducibility and the abundance of conflicting mechanisms and theories published to explain the same phenomenon, make it even harder to understand these mixed oxide TFTs, let alone improve their stability.

The discussion above is merely provided for general background information and is not intended to be used as an aid in determining the scope of the claimed subject matter.

BRIEF DESCRIPTION OF THE INVENTION

A digital radiographic (DR) detector uses an IGZO active layer in the switching element for each imaging pixel in a two-dimensional array of imaging pixels. Each imaging pixel has a photo-sensitive element and the switching element. Read-out circuits electrically connected to the two-dimensional array generate a radiographic image by reading out image data by switching on and off the switching elements. The IGZO active layer may be formed having a thickness less than about 7 nm.

Disclosed herein is a DR detector apparatus and a fabrication process for forming imaging pixels in the DR detector, which involves the passivation of the mixed oxide semiconductor layer in situ, so that their bias and light instability, including stability against x-ray radiation exposure, can be reduced to negligible amounts by decreasing the mixed oxide semiconductor thickness down to about 3 nm to 10 nm. Through reproduction of experimental results by device simulation, the improved stability exhibited by thin mixed oxide semiconductor TFTs is found to be related to less oxygen-vacancy defects in the bulk of the semiconductor, as their total number decreases with decreasing thickness. It is further disclosed herein, that the NBIS-induced instability caused by x-ray radiation exposure can be reduced by employing very thin mixed oxide semiconductors in the range of about 3 nm to about 10 nm. Experimental evidence shows that the stability against NBIS improves with decreasing semiconductor thickness to the extent of almost complete NBIS immunity when the thickness is about 3 nm. Here, TFTs with an a-IGZO semiconductor are employed as the metal oxide semiconductor TFTs in DR detector arrays because a-IGZO TFTs can be built with the simple and cost-effective inverted staggered structure, and they exhibit high field-effect mobility ($\mu_{FE}$) and low $V_{TH}$, even when the a-IGZO is sputter deposited at room temperature, making it compatible with the existing amorphous silicon (a-Si) fabrication.

In one embodiment, a digital radiographic detector includes a two-dimensional array of imaging pixels having a photo-sensitive element and a switching element. Read-out circuits are electrically coupled to the array of imaging pixels to generate a radiographic image by reading out image data from the array of imaging pixels. Each switching element in the two-dimensional array of imaging pixels comprises an active layer formed from indium-gallium-zinc oxide having a thickness less than about 7 nm.

In another embodiment, a method of making a DR detector comprises forming: a gate layer on a substrate, an insulator layer over the gate layer, an a-IGZO layer over the insulator layer, and a first passivation layer over the a-IGZO layer. The a-IGZO layer and the first passivation layer are then patterned into individual isolated islands. Thereafter, there is formed: a source and a drain in electrical contact with the a-IGZO layer, a second passivation layer over the source and the drain, and a scintillator layer over the second passivation layer to form an a-IGZO TFT. Read-out circuits are then electrically connected to the active layer in the TFT. The TFT and read-out circuits are enclosed within a DR detector housing.

The summary descriptions above are not meant to describe individual separate embodiments whose elements are not interchangeable. In fact, many of the elements described as related to a particular embodiment can be used together with, and possibly interchanged with, elements of other described embodiments. Many changes and modifications may be made within the scope of the present invention without departing from the spirit thereof, and the invention includes all such modifications. The drawings below are intended to be drawn neither to any precise scale with respect to relative size, angular relationship, relative position, or timing relationship, nor to any combinational relationship with respect to interchangeability, substitution, or representation of a required implementation.

This brief description of the invention is intended only to provide a brief overview of subject matter disclosed herein according to one or more illustrative embodiments, and does not serve as a guide to interpreting the claims or to define or limit the scope of the invention, which is defined only by the appended claims. This brief description is provided to introduce an illustrative selection of concepts in a simplified form that are further described below in the detailed description. This brief description is not intended to identify key features or essential features of the claimed subject matter, nor is it intended to be used as an aid in determining the scope of the claimed subject matter. The claimed subject matter is not limited to implementations that solve any or all disadvantages noted in the background.

BRIEF DESCRIPTION OF THE DRAWINGS

So that the manner in which the features of the invention can be understood, a detailed description of the invention may be had by reference to certain embodiments, some of which are illustrated in the accompanying drawings. It is to be noted, however, that the drawings illustrate only certain embodiments of this invention and are therefore not to be considered limiting of its scope, for the scope of the invention encompasses other equally effective embodiments. The drawings are not necessarily to scale, emphasis generally being placed upon illustrating the features of certain embodiments of the invention. In the drawings, like numerals are used to indicate like parts throughout the various views. Thus, for further understanding of the invention, reference can be made to the following detailed description, read in connection with the drawings in which:

FIG. 6(c) tabulates key TFT parameters;

FIG. 9(a) shows X-ray diffraction (XRD) patterns, FIG. 9(b) shows the transmittance, FIG. 9(c) the Tauc's plot, and FIG. 9(d) the X-ray photon electron spectroscopy (XPS) measurements.

DETAILED DESCRIPTION OF THE INVENTION

Figure 1:
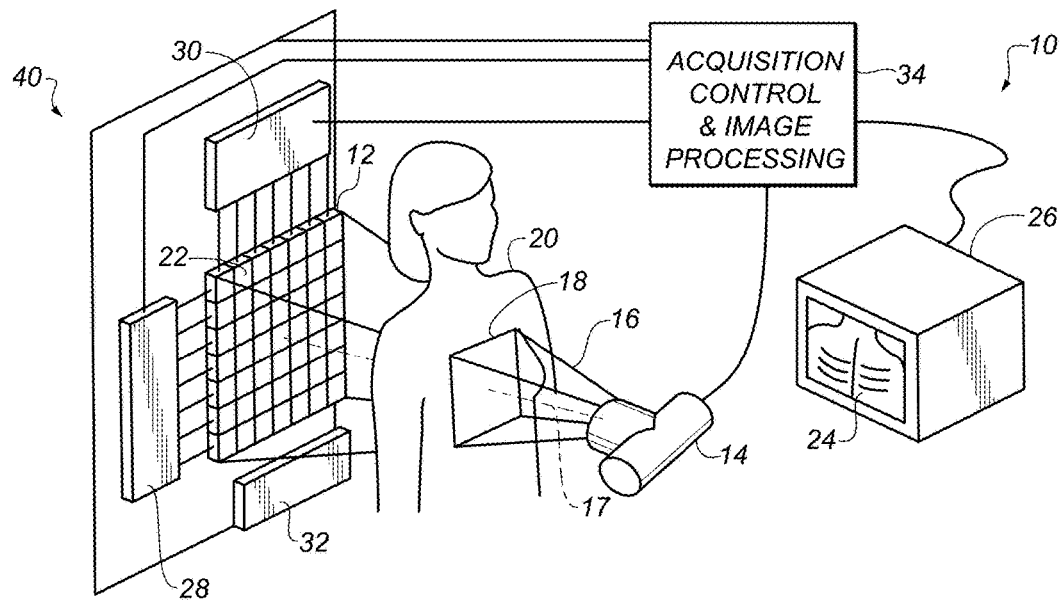
FIG. 1 is a perspective view of an exemplary radiographic imaging system.

FIG. 1 is a perspective view of a digital radiographic (DR) imaging system 10 that includes a generally planar DR detector 40 (shown without a housing for clarity of description), an x-ray source 14 configured to generate radiographic energy (x-ray radiation), and a digital monitor 26 configured to display images captured by the DR detector 40, according to one embodiment. The DR detector 40 may include a two dimensional array 12 of detector cells 22 (photosensors), arranged in electronically addressable rows and columns. The DR detector 40 may be positioned to receive x-rays 16 passing through a subject 20 during a radiographic energy exposure, or radiographic energy pulse, emitted by the x-ray source 14. As shown in FIG. 1, the radiographic imaging system 10 may use an x-ray source 14 that emits collimated x-rays 16, e.g. an x-ray beam, selectively aimed at and passing through a preselected region 18 of the subject 20. The x-ray beam 16 may be attenuated by varying degrees along its plurality of rays according to the internal structure of the subject 20, which attenuated rays are detected by the array 12 of photosensitive detector cells 22. The planar DR detector 40 is positioned, as much as possible, in a perpendicular relation to a substantially central ray 17 of the plurality of rays 16 emitted by the x-ray source 14. The array 12 of individual photosensitive cells (pixels) 22 may be electronically read out (scanned) by their position according to column and row. As used herein, the terms "column" and "row" refer to the vertical and horizontal arrangement of the photosensor cells 22 and, for clarity of description, it will be assumed that the rows extend horizontally and the columns extend vertically. However, the orientation of the columns and rows is arbitrary and does not limit the scope of any embodiments disclosed herein. Furthermore, the term "subject" may be illustrated as a human patient in the description of FIG. 1, however, a subject of a DR imaging system, as the term is used herein, may be a human, an animal, an inanimate object, or a portion thereof.

In one exemplary embodiment, the rows of photosensitive cells 22 may be scanned one or more at a time by electronic scanning circuit 28 so that the exposure data from the array 12 may be transmitted to electronic read-out circuit 30. Each photosensitive cell 22 may independently store a charge proportional to an intensity, or energy level, of the attenuated radiographic radiation, or x-rays, received and absorbed in the cell. Thus, each photosensitive cell, which may be referred to herein as an "imaging pixel" or simply "pixel" as the context may indicate, when read-out, provides exposure intensity information, or a datum, defining a pixel of a radiographic image 24, e.g. a brightness level or an amount of energy absorbed by the pixel, that may be digitally decoded by acquisition control and image processing electronics 34, i.e., a read-out circuit or read-out circuit integrated circuit (ROIC), and transmitted to be displayed by the digital monitor 26 for viewing by a user. An electronic bias circuit 32 is electrically connected to the two-dimensional detector array 12 to provide a bias voltage to each of the photosensitive cells 22.

Each of the bias circuit 32, the scanning circuit 28, and the read-out circuit 30, may communicate with an acquisition control and image processing unit 34 over a connected cable (wired), or the DR detector may be equipped with a wireless transmitter to transmit radiographic image data wirelessly to the acquisition control and image processing unit 34. The acquisition control and image processing unit 34 may include a processor and electronic memory (not shown) to control operations of the DR detector 40 as described herein, including control of circuits 28, 30, and 32, for example, by use of programmed instructions. The acquisition control and image processing unit 34 may also be used to control activation of the x-ray source 14 during a radiographic exposure, controlling an x-ray tube electric current magnitude, and thus the fluence of x-rays in x-ray beam 16, and the x-ray tube voltage, and thus the energy level of the x-rays in x-ray beam 16.

The acquisition control and image processing unit 34 may store a plurality of data frames received from the DR detector and transmit image (pixel) data to the monitor 26, based on the radiographic exposure data received from the array 12 of photosensitive cells 22 in the DR detector 40. Alternatively, acquisition control and image processing unit 34 may process the image data and store it, or it may store raw unprocessed image data, in local or remotely accessible memory.

With regard to a direct detection embodiment of DR detector 40, the photosensitive cells 22 may each include a sensing element sensitive to x-rays, i.e. it absorbs x-rays and generates an amount of charge carriers in proportion to a magnitude of the absorbed x-ray energy. A switching element, having a thin a-IGZO active layer as described herein, may be configured to be selectively activated to read out the charge level of a corresponding x-ray sensing element. With regard to an indirect detection embodiment of DR detector 40, photosensitive cells 22 may each include a sensing element sensitive to light rays in the visible spectrum, i.e. it absorbs light rays and generates an amount of charge carriers in proportion to a magnitude of the absorbed light energy, and an a-IGZO switching element that is selectively activated to read the charge level of the corresponding sensing element. A scintillator, or wavelength converter, is disposed over the light sensitive sensing elements and the switching elements to convert incident x-ray radiographic energy to visible light energy. Thus, in the embodiments disclosed herein, it should be noted that the DR detector 40 may include an indirect or direct type of DR detector.

Examples of sensing elements used in sensing array 12 include various types of photoelectric conversion devices (e.g., photosensors) such as photodiodes (P-N or PIN diodes), photo-capacitors (MIS), photo-transistors or photoconductors. Examples of switching elements used in conjunction with prior art signal read-out circuits include MOS transistors, bipolar transistors, and other p-n junction components. In one embodiment, as disclosed herein, very thin active layer a-IGZO is used to fabricate the switching transistors.

Figure 2:
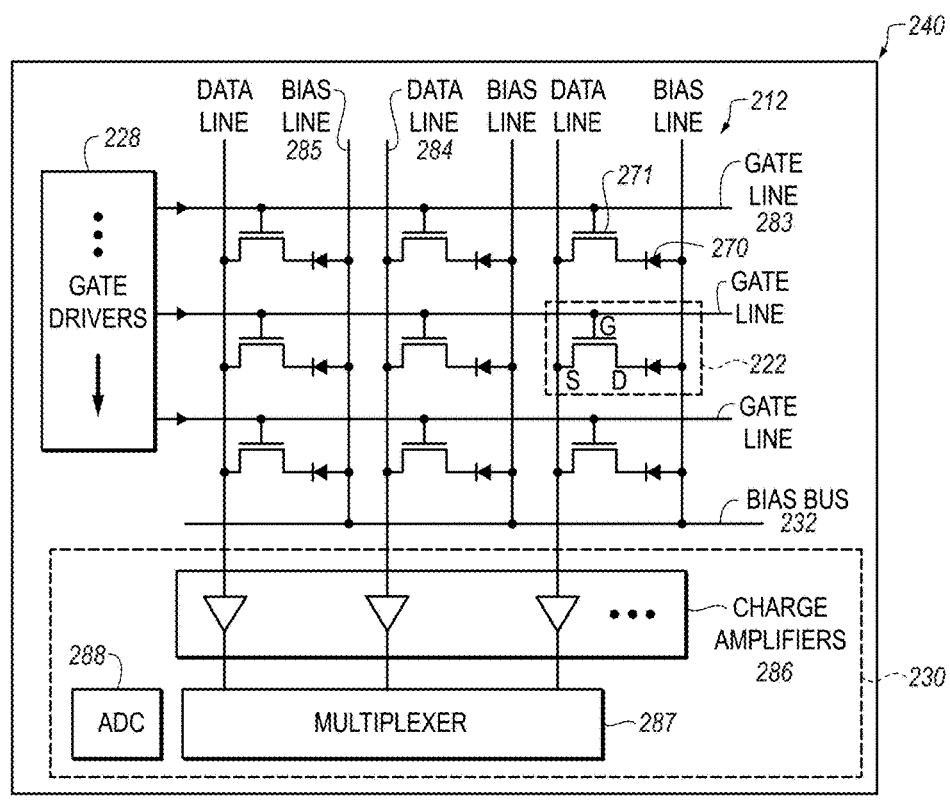
FIG. 2 is a schematic diagram of a portion of an exemplary imaging array in a DR detector used in the exemplary radiographic imaging system of FIG. 1.

FIG. 2 is a schematic diagram 240 of a portion of a two-dimensional array 12 for the DR detector 40. The array of photosensor cells 212, whose operation may be consistent with the photosensor array 12 described above, may include a number of hydrogenated amorphous silicon (a-Si:H) n-i-p photodiodes 270 and TFTs 271 formed as a-IGZO TFTs each having gate (G), source (S), and drain (D) terminals, fabricated as described herein. In embodiments of DR detector 40 disclosed herein, such as a multilayer DR detector, the two-dimensional array of photosensor cells 12 may be formed in a device layer (402 FIG. 4) that abuts adjacent layers of the DR detector structure. A plurality of gate driver circuits 228 may be electrically connected to a plurality of gate lines 283 which control a voltage applied to the gates of TFTs 271, a plurality of readout circuits 230 may be electrically connected to data lines 284, and a plurality of bias lines 285 may be electrically connected to a bias line bus or a variable bias reference voltage line 232 which controls a voltage applied to the photodiodes 270. Charge amplifiers 286 may be electrically connected to the data lines 284 to receive signals therefrom. Outputs from the charge amplifiers 286 may be electrically connected to a multiplexer 287, such as an analog multiplexer, then to an analog-to-digital converter (ADC) 288, or they may be directly connected to the ADC, to stream out the digital radiographic image data at desired rates. In one embodiment, the schematic diagram of FIG. 2 may represent a portion of a DR detector 40 such as an indirect flat panel imager based on a-Si:H photosensors and a-IGZO based switching elements.

Incident x-rays, or x-ray photons, 16 may be converted to optical photons, or light rays, by the scintillator layer (404 FIG. 4), which light rays are subsequently converted to electron-hole pairs, or charges, upon impacting the a-Si:H n-i-p photodiodes 270. In one embodiment, an exemplary detector cell 222, which may be equivalently referred to herein as a pixel, may include a photodiode 270 having its anode electrically connected to a bias line 285 and its cathode electrically connected to the drain (D) of TFT 271. The bias reference voltage line 232 may control a bias voltage of the photodiodes 270 at each of the detector cells 222. The charge capacity of each of the photodiodes 270 is a function of its bias voltage and its capacitance. In general, a reverse bias voltage, e.g. a negative voltage, may be applied to the bias lines 285 to create an electric field (and hence a depletion region) across the p-n junction of each of the photodiodes 270 to enhance its collection efficiency for the charges generated by incident light rays. The image signal represented by the array of photosensor cells 212 may be integrated by the photodiodes while their associated TFTs 271 are held in a non-conducting (off) state, for example, by maintaining the gate lines 283 at a negative voltage via the gate driver circuits 228. The photosensor cell array 212 may be read out by sequentially switching rows of the TFTs 271 to a conducting (on) state by means of the gate driver circuits 228. When a row of the pixels 22 is switched to a conducting state, for example by applying a positive voltage to the corresponding gate line 283, collected charge from the photodiode in those pixels may be transferred along data lines 284 and integrated by the external charge amplifier circuits 286. The row may then be switched back to a non-conducting state, and the process is repeated for each row until the entire array of photosensor cells 212 has been read out. The integrated signal outputs are transferred from the external charge amplifiers 286 to an analog-to-digital converter (ADC) 288 using a parallel-to-serial converter, such as multiplexer 287, which together comprise read-out circuit 230.

This digital image information may be subsequently processed by image processing system 34 to yield a digital image which may then be digitally stored and immediately displayed on monitor 26, or it may be displayed at a later time by accessing the digital electronic memory containing the stored image. The flat panel DR detector 40 having an imaging array as described with reference to FIG. 2 is capable of both single-shot (e.g., static, radiographic) and continuous (e.g., fluoroscopic) image acquisition. In one embodiment, a significant portion or all of the imaging electronics of image processing system 34 may be disposed on board the DR detector 40 so that several image processing steps described herein may be performed entirely on board the DR detector 40 to the extent that a large number of captured radiographic images may be digitally processed, compensated, corrected, and stored in electronic memory on-board the DR detector 40. Thus, the DR detector 40 may include sufficient electronic memory, which may be referred to herein as frame buffers, to temporarily or permanently store captured image frames and perform processing as described herein.

Figure 3:
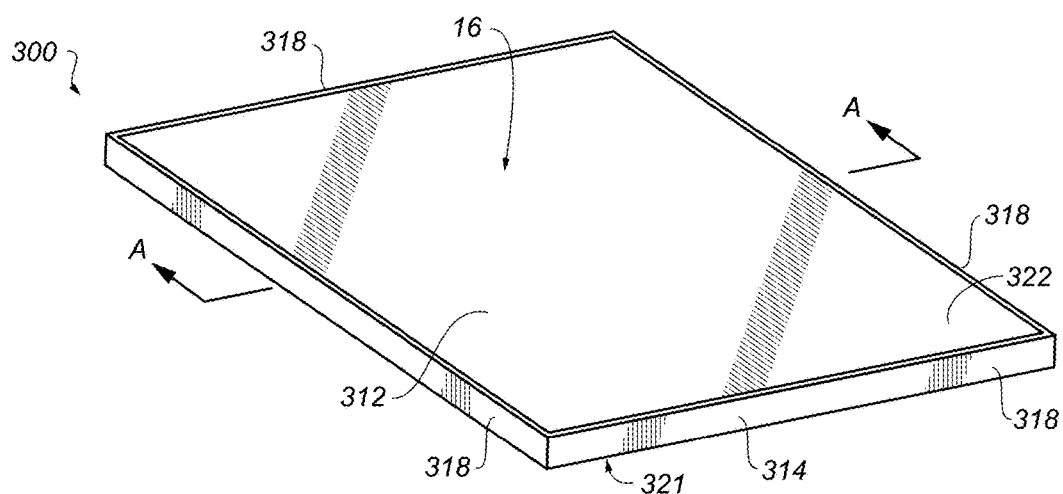
FIG. 3 shows a perspective view of an exemplary portable wireless DR detector.

FIG. 3 shows a perspective view of an exemplary, generally rectangular, planar, portable wireless DR detector 300 according to an embodiment of DR detector 40 disclosed herein. The DR detector 300 may include a housing 314 that encloses a multilayer structure comprising the photosensor array portion 22 of the DR detector 300. The housing 314 of the DR detector 300 may include a continuous, rigid, radio-opaque enclosure surrounding an interior volume of the DR detector 300. The housing 314 may comprise four orthogonal edges 318 and a bottom side 321 disposed opposite a top side 322 of the DR detector 300. A top cover 312 encloses the top side 322 which, together with the housing 314 substantially encloses the multilayer structure in the interior volume of the DR detector 300, and may be attached to the housing 314 to form a seal therebetween. The top cover 312 may be made of a material that passes x-rays 16 without significant attenuation thereof, i.e., a radiolucent material, such as a carbon fiber or plastic material.

Figure 4:
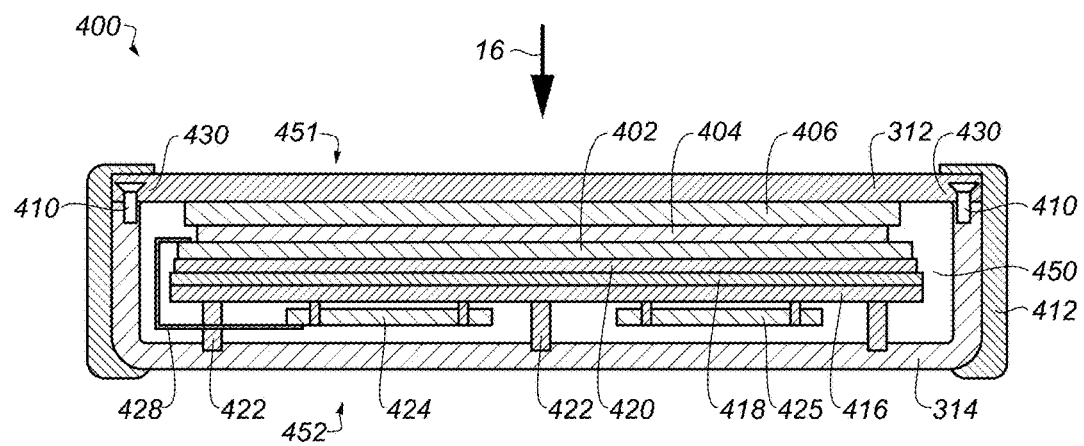
FIG. 4 is an exemplary cross-sectional view along section line A-A of the portable wireless DR detector of FIG. 3.

With reference to FIG. 4, there is illustrated in schematic form an exemplary cross-section view along section A-A of the exemplary embodiment of the DR detector 300 (FIG. 3). For spatial reference purposes, one major surface of the DR detector 400 may be referred to as the top side 451 and a second major surface may be referred to as the bottom side 452, as used herein. The multilayer imaging structure is disposed within the interior volume 450 enclosed by the housing 314 and top cover 312 and may include a scintillator layer 404 over the two-dimensional imaging sensor array 12 shown schematically as the device layer 402. The scintillator layer 404 may be directly under (e.g., directly connected to) the radiolucent top cover 312, and the imaging array 402 may be directly under the scintillator 404. Alternatively, a flexible layer 406 may be positioned between the scintillator layer 404 and the top cover 312 as part of the multilayer structure to provide shock absorption. The flexible layer 406 may be selected to provide an amount of flexible support for both the top cover 312 and the scintillator 404, and may comprise a foam rubber type of material.

A substrate layer 420 may be disposed under the imaging array 402, such as a rigid glass layer upon which the array of photosensors 402 is formed, and may comprise another layer of the multilayer structure. Under the substrate layer 420 a radio-opaque shield layer 418 may be used as an x-ray blocking layer to help prevent scattering of x-rays passing through the substrate layer 420 as well as to block x-rays reflected from other surfaces in the interior volume 450. Readout electronics, including the scanning circuit 28, the read-out circuit 30, and the bias circuit 32 (FIG. 1) may be formed co-planar with the imaging array 402 or, as shown, may be disposed below frame support member 416 in the form of integrated circuits electrically connected to printed circuit boards 424, 425. The frame support member 416 is fixed to the housing 314 using frame support beams 422 to provide support for the multilayer structure just described. The imaging array 402 is electrically connected to the readout electronics, 28, 30, 32, over a flexible connector 428 which may comprise a plurality of flexible, sealed conductors. X-ray flux may pass through the radiolucent top panel cover 312, in the direction represented by an exemplary x-ray beam 16, and impinge upon scintillator 404 where stimulation by the high-energy x-rays 16, or photons, causes the scintillator 404 to emit lower energy photons as visible light rays which are then received in the photosensors of imaging array 402. The frame support member 416 may securely mount the multilayer structure to the housing 314 and may further operate as a shock absorber by disposing elastic pads (not shown) between the frame support beams 422 and the housing 314. Fasteners 410, such as screws, may be used to fixedly attach the top cover 312 to the housing 314 and create a seal therebetween in the region 430 where they come into contact. In one embodiment, an external bumper 412 may be attached along the edges 318 of the DR detector 400 to provide additional shock-absorption.

An exemplary fabrication process of the a-IGZO TFTs disclosed herein is illustrated in FIG. 5. A 60 nm thick molybdenum (Mo) layer is deposited on a glass substrate by sputtering, and is patterned by standard lithography to form the gate electrode (FIG. 5(a)). This is followed by the consecutive deposition of a 250 nm-thick $SiO_2$ layer by plasma enhanced chemical vapor deposition (PECVD) as the gate-insulator at 380° C., deposition of an a-IGZO layer by sputtering at 200° C., and deposition of a 100 nm-thick $SiO_2$ back passivation layer by PECVD at 200° C. such as in a cluster deposition tool, without breaking vacuum (FIG. 5(b)). This step ensures the in situ passivation of the a-IGZO immediately after deposition to realize an uncontaminated and very stable a-IGZO layer. Samples with a-IGZO thicknesses ($t_{IGZO}$) of about 3 nm, about 5 nm, about 10 nm, about 20 nm, about 50 nm and about 100 nm were fabricated and tested as described herein. The sputtering of the a-IGZO was performed using a polycrystalline IGZO target ($In_2O_3$: $Ga_2O_3$:ZnO=1:1:1 mol %) at 200° C. The Ar:$O_2$ gas ratio was set at 4:8 for sputtering.

Figure 5A:
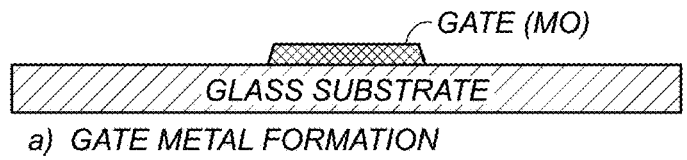
FIGS. 5(a)-(e) is a step-wise flow diagram of exemplary steps of forming a TFT, whereby the consecutive deposition of a $SiO_2$ layer by PECVD as the gate-insulator, deposition of an a-IGZO layer by sputtering, and deposition of a $SiO_2$ back passivation layer by PECVD in a cluster deposition tool, without breaking vacuum ensures the in situ passivation of the a-IGZO, immediately after deposition, which ensures an uncontaminated and stable a-IGZO layer.
Figure 5B:
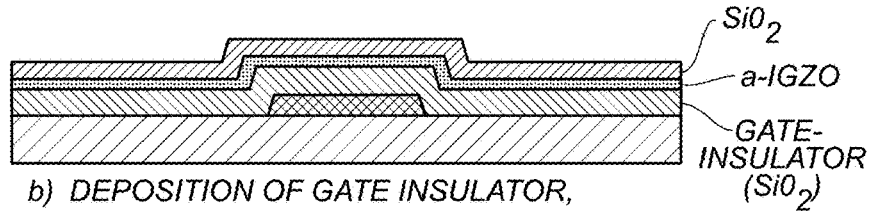
Figure 5C:
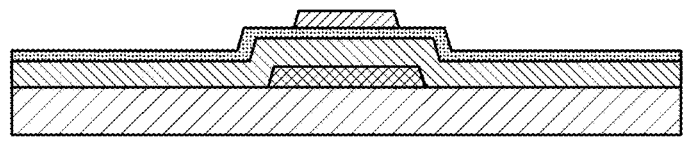
Figure 5D:
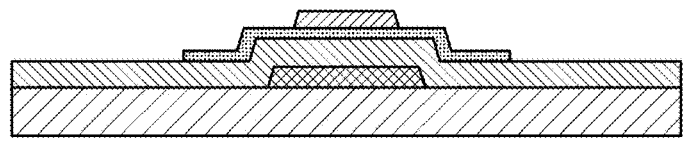
Figure 5E:
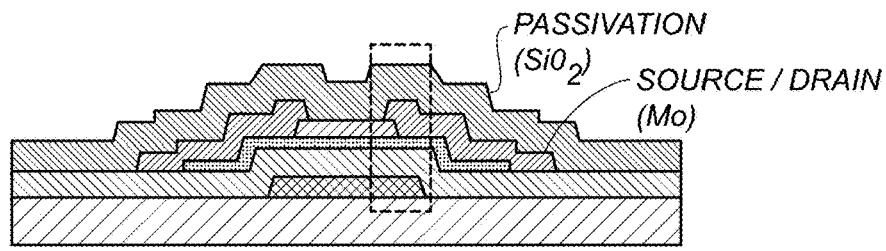

The top $SiO_2$ layer (FIG. 5(b)), which is a protective layer, commonly referred to as "etch stopper", is patterned to expose the source and drain regions for the metal contacts (FIG. 5(c)). During the fabrication process, the etch stopper protects the a-IGZO from exposure to air and also shields it from being etched away or contaminated by the etchant used to define the source/drain electrodes. After patterning the etch-stopper, the a-IGZO layer is patterned to form individual isolated active islands (FIG. 5(d)). Following this, a Mo layer is deposited and patterned to form the source/drain electrode contacts, and then another 200 nm-thick $SiO_2$ layer is deposited by PECVD as the final TFT passivation layer (FIG. 5(e)). An annealing process is carried out at 250° C. in vacuum to ensure a reproducible unstressed state. Electrical contacts are thereafter formed to make electrical connections to the source, drain, and the gate. A two dimensional array of TFT elements formed by the method just described may have a scintillator layer placed thereon using any one of various known methods such as coating, deposition, lamination, etc., to form device/scintillator layers such as the combination of device layer 402 and scintillator layer 404 in the DR detector of FIG. 4.

Figure 6A:
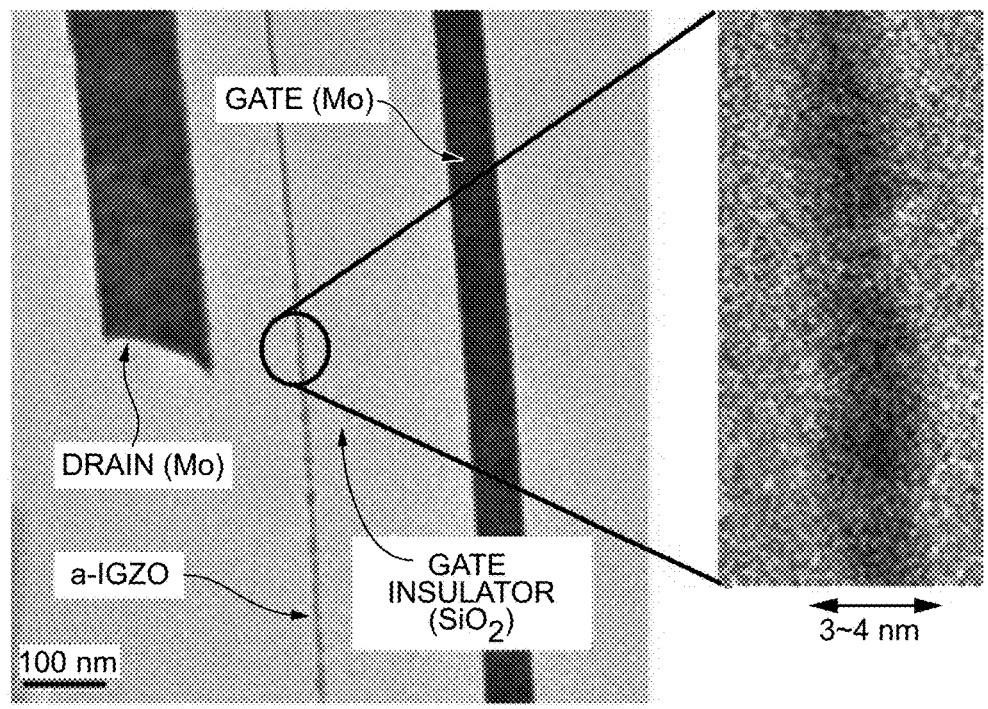
FIGS. 6(a)-(b) illustrate a structure and operational characteristics of an a-IGZO TFT, respectively, wherein (a) shows a TEM image of the TFT area indicated by the dashed-line rectangle in FIG. 5(e) of an a-IGZO TFT fabricated with an a-IGZO thickness ($t_{IGZO}$) ranging from about 3 nm to about 4 nm and (b) shows transfer characteristics as a function of $t_{IGZO}$ whereby turn-on voltage shifts negatively, while the on-state currents increase with increasing $t_{IGZO}$.
Figure 9A:
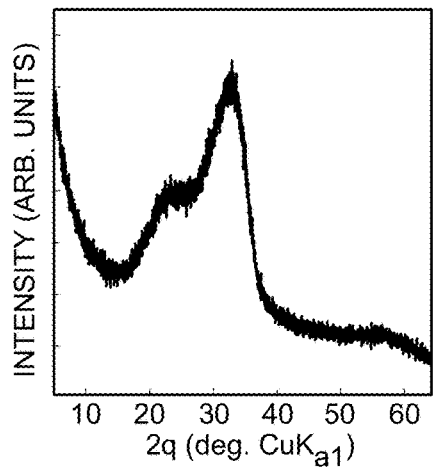
FIGS. 9(a)-(d) illustrate material properties of a-IGZO films whereby
Figure 9B:
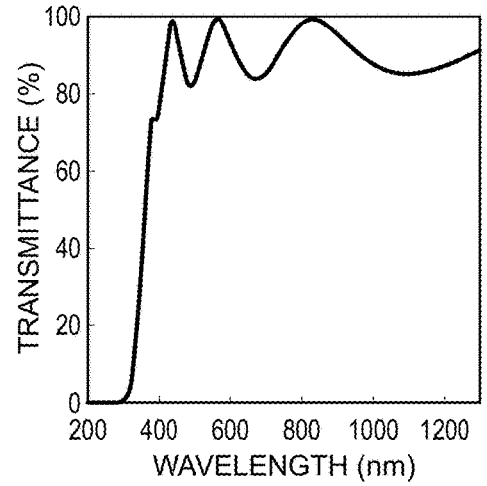
Figure 9C:
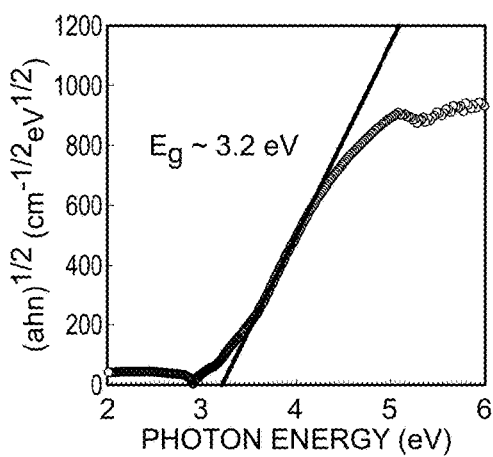
Figure 9D:
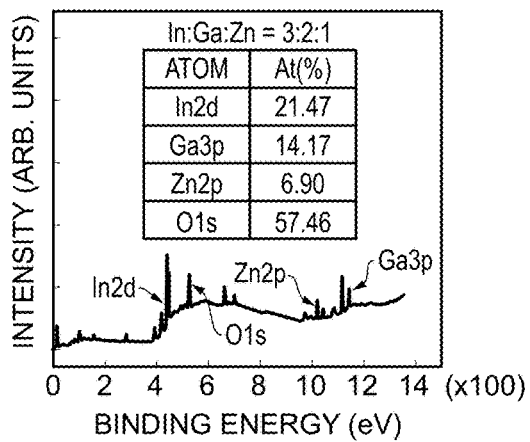

TFT layer thicknesses produced by the method described herein were confirmed by transmission electron microscopy (TEM) images as shown in FIG. 6(a) for the case of a TFT with $t_{IGZO}$ of about 3 nm and in FIGS. 8(a)-(d) for the TFTs with $t_{IGZO}$ of 10, 20, 50 and 100 nm For material analysis, the crystallinity and chemical composition of the IGZO layers were respectively determined by X-ray defraction (XRD) patterns and X-ray photon electron spectroscopy (XPS). In XRD FIGS. 9(a)-(d), the IGZO films do not exhibit sharp defraction peaks assignable to a crystalline phase but have two halo peaks at 32° and 56° (FIG. 9(a)), indicating that they are amorphous. The a-IGZO film is transparent in the visible light wavelength range (FIG. 9(b)), owing to its large band gap equivalent to about 3.2 eV (FIG. 9(c)). X-ray diffraction spectroscopy (XPS) results show that the a-IGZO chemical composition is In:Ga:Zn=3:2:1 in atomic ratio (FIG. 9(d)).

The TFT characteristics measurements described herein were measured in dark and at room temperature. Current-voltage (I-V) characteristics were measured using an Agilent 4156C precision semiconductor parameter analyzer, whereas capacitance-voltage (C-V) characteristics were recorded with an Agilent E4980A Precision LCR Meter by superimposing to the gate DC voltage ($V_{GS}$) a small AC signal (0.1 V) of frequency 1 kHz, keeping the source and drain shorted. In these conditions, the surface potential $\psi_S$, as well as its AC modulation, are uniform along the channel. The $\mu_{FE}$ is derived from the transconductance ($g_M$) with $V_{DS}$=0.1 V and at gate voltage ($V_{GS}$) of 10 V. The $V_{ON}$ is taken as the $V_{GS}$ at which the drain current ($I_{DS}$) starts to monotonically increase. The subthreshold voltage swing (SS) is taken as the minimum value of (d log ($I_{DS}$)/d $V_{GS}$)$^{-1}$. The flat band interface trap density ($N_{int}$), and gap state density per unit energy ($dN_{gap}/dE$) are extracted using a method involving a combined analysis of the TFT's I-V and capacitance-voltage (C-V) characteristics. $dN_{gap}/dE$ is obtained by the differential of the gap charge ($Q_{gap}$) with respect to surface potential ($\Psi_S$), $dQ_{gap}/d\Psi_S$. Definitions of $Q_{int}$ and $dQ_{gap}/d\Psi_S$ are described in *Determination of flat band voltage in thin film transistors: The case of amorphous-indium gallium zinc oxide*, Migliorato, P., Seok M. J., & Jang, J. *Appl. Phys. Lett.* Vol. 100, No. 7, pp. 073506 (February 2012); where $Q_{gap}=Q_{int}+Q_B$ (bulk trap charge).

Figure 6B:
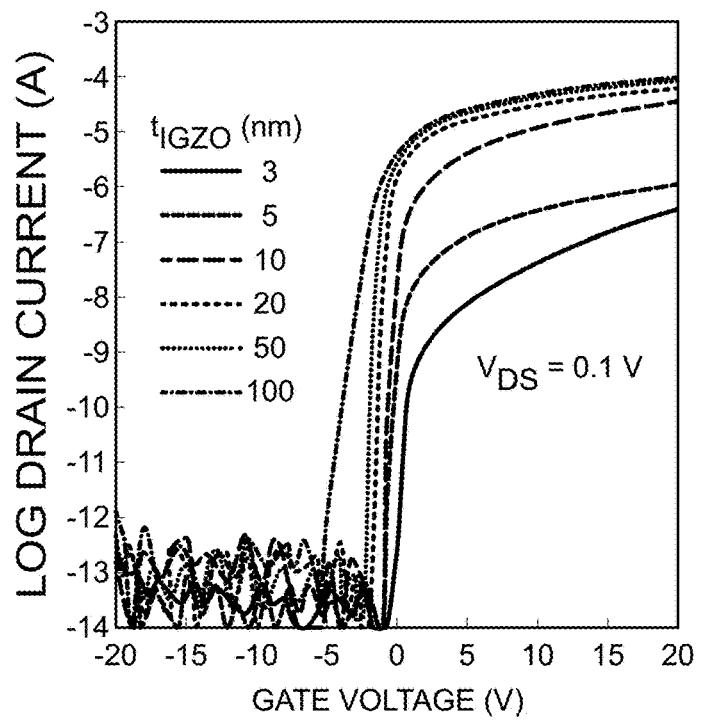
Figure 7A:
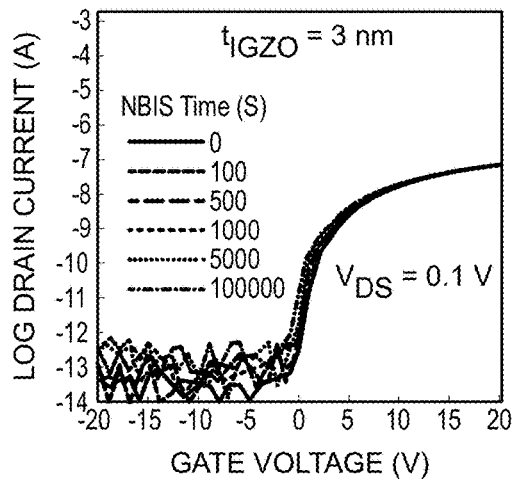
FIGS. 7(a)-(e) illustrate TFT current-voltage (I-V) characteristics before and after NBIS for varying a-IGZO thickness ($t_{IGZO}$)
Figure 7B:
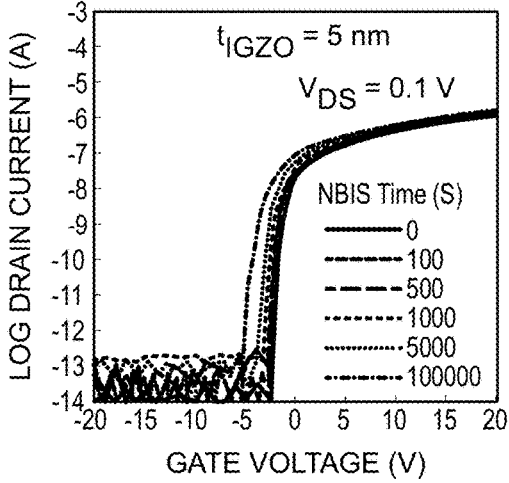
Figure 7C:
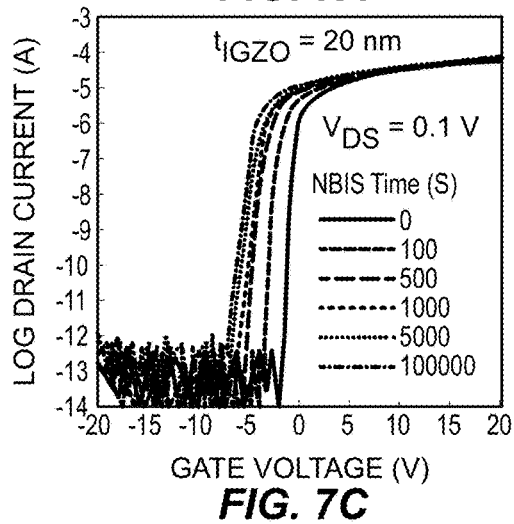
Figure 7D:
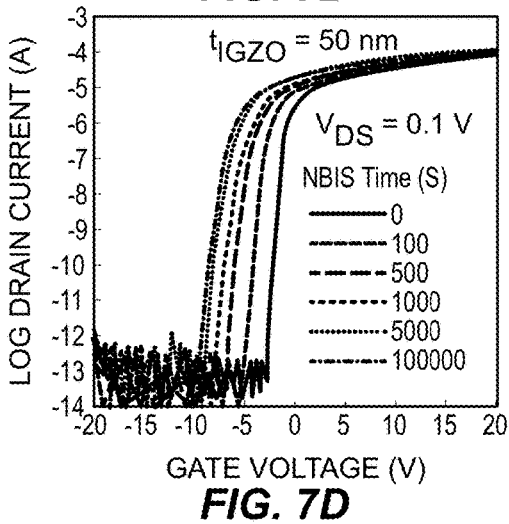
Figure 7E:
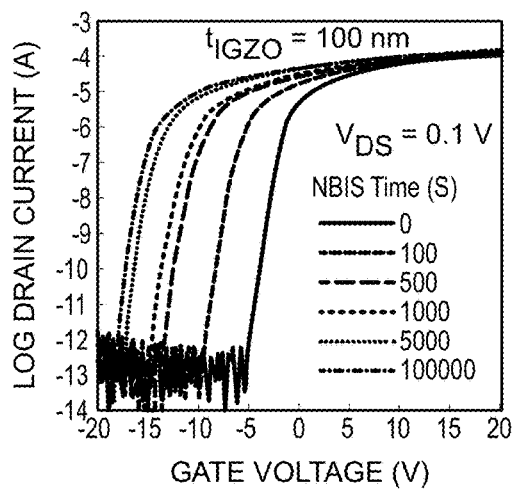
Figure 7F:
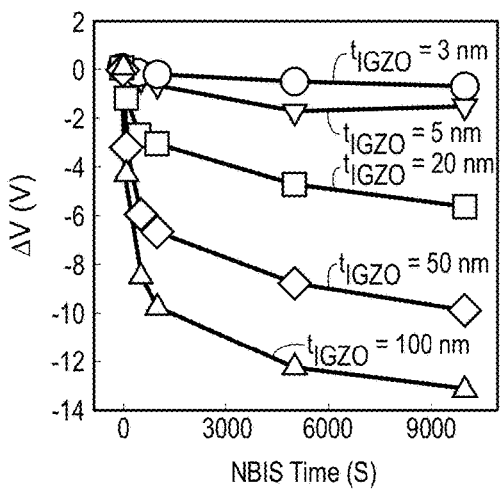
FIG. 7(f) illustrates turn-on voltage ($V_{ON}$) dependence on NBIS time; test parameters include channel width (W)=2000 μm and channel length (L)=10 μm, the NBIS-induced negative $V_{ON}$ shift ($\Delta V_{ON}$) increases with increasing $t_{IGZO}$, and NBIS is accomplished by holding the TFT $V_{GS}$ at −20 V for 10000 s, while biasing the source and drain electrodes at zero volts, under white light illumination (9000 nit)
Figure 8A:
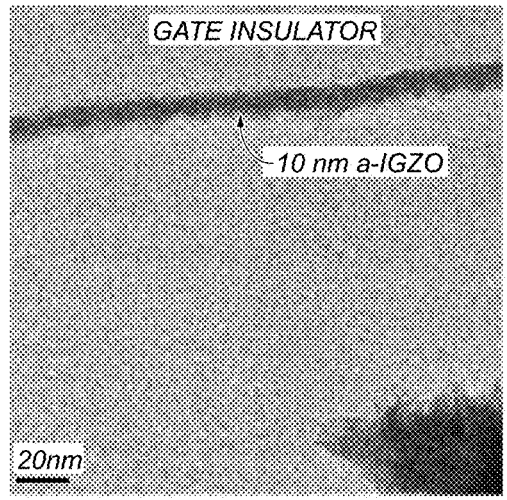
FIGS. 8(a)-(d) illustrate transmission electron microscope (TEM) images of parts of TFTs with a-IGZO thickness ($t_{IGZO}$) of (a) 10 nm, (b) 20 nm, (c) 50 nm, and (d) 100 nm.
Figure 8B:
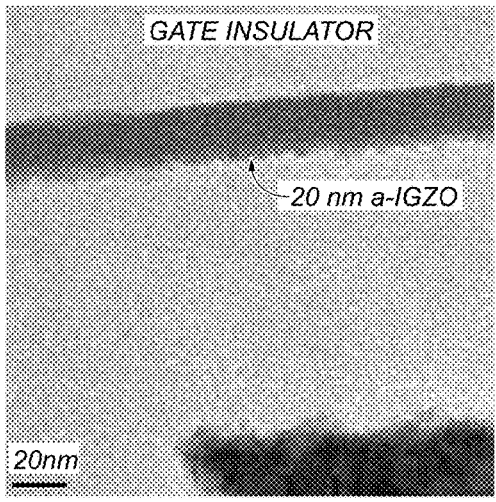
Figure 8C:
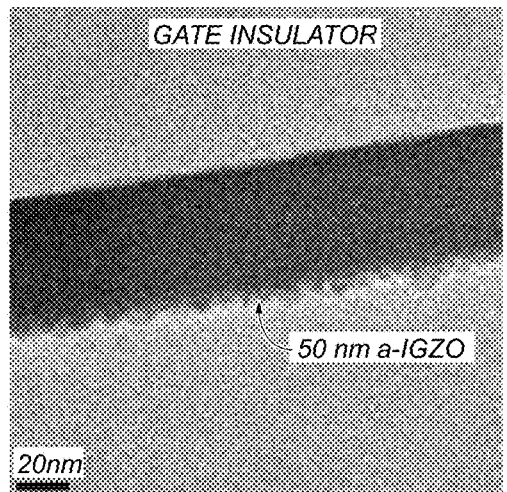
Figure 8D:
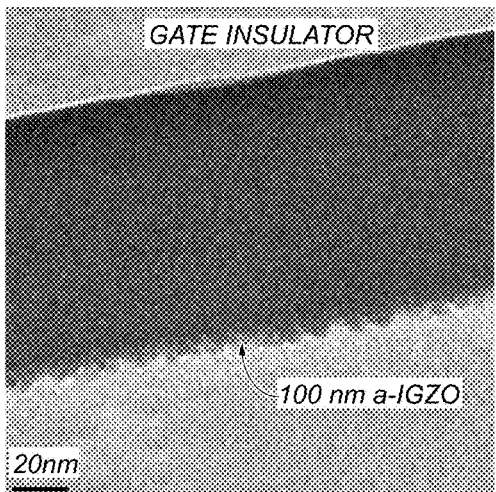

When the TFT current-voltage (I-V) characteristics are measured as a function of $t_{IGZO}$, a clear dependency on $t_{IGZO}$ can be seen. For instance, TFT on-state currents, subthreshold voltage swing (SS), and turn-on voltage ($V_{ON}$) change with $t_{IGZO}$ (FIG. 6(b)). Previous reports also show similar effects of $t_{IGZO}$ on TFT parameters. The drop in the on-state currents and positive shift of $V_{ON}$ with decreasing $t_{IGZO}$ are not due to shallow trap states because SS is smaller for thinner channels (FIG. 6(b)). Instead, these changes are consistent with a decrease in carrier concentration or increase in deep electron traps at the a-IGZO film surface as $t_{IGZO}$ becomes very small. A list of key TFT parameters as a function of $t_{IGZO}$, before and after application of NBIS can found in the table of FIG. 6(c). The NBIS is accomplished by holding the TFT $V_{GS}$ at −20 V for 10000 s, while biasing the source and drain electrodes at zero volts, under white light illumination (9000 nit). The negative $\Delta V_{ON}$ induced by NBIS decreases with decreasing $t_{IGZO}$ (FIG. 7(a-e)). The NBIS time dependency of the $\Delta V_{ON}$ for these TFTs is shown in FIG. 7(f). Note that when $t_{IGZO}$ is equal to about 3 nm, the $\Delta V_{ON}$ is small.

Experiments have shown that stability against negative threshold voltage shift caused by x-ray radiation exposure is better in a-IGZO TFTs with thin active layers compared to those with thicker active layers. The number of x-rays being absorbed in the a-IGZO decreases as the thickness of the IGZO decreases, so thin a-IGZO results in fewer absorbed x-rays and fewer defects. Simulation of the impact of uniformly distributed defect states on the electrostatic potential and electron concentration in the TFT determined the effect of defect density on threshold voltage for a-IGZO of various thickness. Simulations show that for the same increase in the concentration of donors, the negative $V_{ON}$ shift is less in TFTs with thinner active layers compared to those with thicker active layers. This improves the lifetime performance levels of DR detectors that utilize a-IGZO switching elements by avoiding $V_{ON}$ that tends to decrease (shift to left) over time. This is attributed to less metastable defects per unit surface in a thinner active layer compared to thicker active-layers. The variations in performance and theories from research group to research group are closely related to the sensitivity of mixed oxide semiconductors to air or chemicals. Exposure to air should be avoided, not only after device fabrication (FIG. 5(d)), but more importantly during the fabrication process itself (FIG. 5(b)). If a device is fabricated with neither an etch-stopper nor a passivation layer, the device stability will improve with increasing active layer (a-IGZO) thickness. Thick a-IGZO layers will have a self-passivation effect by the intrinsic a-IGZO, even though the surface region is affected by moisture or oxygen from ambient air; i.e. the thicker the a-IGZO layer is, the farther away is the front channel accumulation layer (bottom surface of the semiconductor layer) from the desorption and adsorption properties occurring at the top surface.

For devices fabricated without an etch-stopper, the same effect occurs during the fabrication process; for example when the sample is taken out of the a-IGZO deposition/etching chamber to the source and drain metal deposition chamber. More importantly, if vacuum is broken between deposition of the a-IGZO and etch-stopper, in cases where the two processes have to be done in two different chambers;

significant contamination to the a-IGZO layer will occur during the transfer from the a-IGZO deposition chamber to the etch-stopper deposition chamber. This is very important but often overlooked. In the case of devices presented herein, a cluster deposition tool that allows consecutive deposition of the gate-insulator, active-layer, and etch-stopper without breaking vacuum, is used. The a-IGZO is therefore passivated throughout the whole fabrication process. It should, therefore, be emphasized that due to fabrication process optimization, intrinsic, rather than process related instability mechanisms, were able to be detected.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal language of the claims.

What is claimed is:

1. A digital radiographic detector comprising:
   a two-dimensional array of imaging pixels, each imaging pixel comprising a photo-sensitive element and a switching element;
   read-out circuits electrically coupled to the two-dimensional array of imaging pixels to generate a radiographic image by reading out image data from the two-dimensional array of imaging pixels; and
   a housing enclosing the two-dimensional array of imaging pixels and the read-out circuits,
   wherein each switching element in the two-dimensional array of imaging pixels comprises an active layer formed from indium-gallium-zinc oxide having a thickness less than about 7 nm.

2. The detector of claim 1, wherein the active layer is formed from indium-gallium-zinc oxide having a thickness less than about 5 nm.

3. The detector of claim 1, wherein the active layer is formed from indium-gallium-zinc oxide having a thickness of about 3 nm.

4. The detector of claim 1, wherein the read-out circuits include gate drivers electrically connected to the active layer in each switching element.

5. A DR detector comprising:
   a gate layer on a substrate;
   an insulator layer over the gate layer;
   a patterned a-IGZO active layer over the insulator;
   a patterned first passivation layer over the a-IGZO active layer;
   a source and a drain each in electrical contact with the a-IGZO active layer;
   a second passivation layer over at least the source and the drain;
   a scintillator layer over the second passivation layer;
   a read-out circuit electrically connected to the a-IGZO active layer; and
   a DR detector housing enclosing the gate layer, the insulator layer, the patterned a-IGZO active layer, the patterned first passivation layer, the second passivation layer, the scintillator layer, the source and drain, and the read-out circuit,
   wherein the a-IGZO active layer is formed using sputtering, and wherein the insulator layer and the a-IGZO active layer are formed in a vacuum tight chamber without breaking vacuum.

6. The detector of claim 5, further comprising the second passivation layer disposed over the insulator layer and the first passivation layer.

7. The detector of claim 6, wherein the source and drain comprises molybdenum.

8. The detector of claim 7, wherein the a-IGZO active layer and the first passivation layer comprise isolated islands of the a-IGZO active layer and the first passivation layer.

9. The detector of claim 8, wherein the gate layer comprises molybdenum.

10. A DR detector comprising:
    a gate layer on a substrate;
    only one insulator layer over the gate layer;
    only one patterned a-IGZO active layer over the insulator layer;
    only one patterned first passivation layer over the a-IGZO active layer;
    a source and a drain each in electrical contact with the a-IGZO active layer;
    a second passivation layer over at least the source and the drain;
    a scintillator layer over the second passivation layer;
    a read-out circuit electrically connected to the a-IGZO active layer; and
    a DR detector housing enclosing the gate layer, the insulator layer, the patterned a-IGZO active layer, the patterned first passivation layer, the second passivation layer, the scintillator layer, the source and drain, and the read-out circuit.

11. The DR detector of claim 10, further comprising the second passivation layer over the insulator layer and the first passivation layer.

12. The DR detector of claim 10, wherein the source and drain comprise molybdenum.

13. The DR detector of claim 12, wherein the a-IGZO active layer and the first passivation layer are shaped as isolated islands on the insulator layer.

14. The DR detector of claim 10, wherein the gate layer comprises molybdenum.

15. The DR detector of claim 10, wherein the first passivation layer and the second passivation layer each comprise $SiO_2$.

16. The DR detector of claim 10, wherein the only one patterned a-IGZO active layer comprises a thickness of about 5 nm or less.

17. The DR detector of claim 16, wherein the only one patterned a-IGZO active layer comprises a thickness of about 3 nm.

18. The DR detector of claim 16, wherein the first passivation layer and the second passivation layer comprise a common material.

* * * * *

UNITED STATES PATENT AND TRADEMARK OFFICE
CERTIFICATE OF CORRECTION

PATENT NO. : 10,396,110 B2  
APPLICATION NO. : 16/156278  
DATED : August 27, 2019  
INVENTOR(S) : Ravi K. Mruthyunjaya et al.

Page 1 of 1

It is certified that error appears in the above-identified patent and that said Letters Patent is hereby corrected as shown below:

In the Specification

| | |
|---|---|
| Column 1, Line 31 | Replace "(TFTs) for applications in active matrix displays (AMDS)" with --(TFTs) for applications in active matrix displays (AMDs)-- |
| Column 1, Line 34 | Replace "(a-IGZO). For applications in AMDS," with --(a-IGZO). For applications in AMDs,-- |

Signed and Sealed this  
Twenty-second Day of October, 2019

Andrei Iancu  
*Director of the United States Patent and Trademark Office*